United States Patent
Boesche et al.

(10) Patent No.: US 10,637,457 B2
(45) Date of Patent: Apr. 28, 2020

(54) METHOD AND DEVICE FOR CONTROLLING A SEMICONDUCTOR SWITCH

(71) Applicant: Ellenberger & Poensgen GmbH, Altdorf (DE)

(72) Inventors: Dirk Boesche, Seershausen (DE); Ernst-Dieter Wilkening, Braunschweig (DE)

(73) Assignee: Ellenberger & Poensgen GmbH, Altdorf (DE)

(*) Notice: Subject to any disclaimer, the term of this patent is extended or adjusted under 35 U.S.C. 154(b) by 0 days.

(21) Appl. No.: 16/259,403

(22) Filed: Jan. 28, 2019

(65) Prior Publication Data
US 2019/0173462 A1    Jun. 6, 2019

Related U.S. Application Data

(63) Continuation of application No. PCT/EP2017/068847, filed on Jul. 26, 2017.

(30) Foreign Application Priority Data

Jul. 28, 2016  (DE) .......................... 10 2016 213 944

(51) Int. Cl.
*H03K 17/66* (2006.01)
*H03K 17/0814* (2006.01)
(Continued)

(52) U.S. Cl.
CPC ..... *H03K 17/08146* (2013.01); *H03K 17/063* (2013.01); *H03K 17/08142* (2013.01);
(Continued)

(58) Field of Classification Search
CPC ............. H03K 17/08146; H03K 17/61; H03K 17/668; H03K 17/6874
See application file for complete search history.

(56) References Cited

U.S. PATENT DOCUMENTS 4,438,356 A    3/1984 Fleischer
5,392,188 A *  2/1995 Epstein ................... H02H 9/04
                                                361/111
(Continued)

FOREIGN PATENT DOCUMENTS

DE           200063 A1    3/1983
DE      102011087434 A1    5/2012
(Continued)

OTHER PUBLICATIONS

International Search Report dated Nov. 20, 2017 in corresponding application PCT/EP2017/068847.
(Continued)

*Primary Examiner* — Dinh T Le
(74) *Attorney, Agent, or Firm* — Muncy, Geissler, Olds & Lowe, P.C.

(57) ABSTRACT

A method for controlling an electronic semiconductor switch connected in a load current circuit, the semiconductor switch being connected between an input terminal routed to a source and an output terminal of the load current circuit routed to a load. A control circuit is connected to a supply voltage and has a bridge circuit connected on the primary side to a transformer and to the supply voltage. A load circuit is connected to the transformer on the secondary side, the load circuit having a driver circuit for the semiconductor switch. A threshold value signal is routed to the bridge circuit on the control side. The bridge circuit generates a primary signal which is transmitted as a secondary signal to the load circuit that is galvanically isolated from the control circuit, and wherein the secondary signal is fed to the driver circuit, which generates a drive signal for the semiconductor switch.

12 Claims, 9 Drawing Sheets

(51) Int. Cl.
*H03K 17/687* (2006.01)
*H03K 17/18* (2006.01)
*H03K 17/691* (2006.01)
*H03K 17/06* (2006.01)
*H03K 17/61* (2006.01)

(52) U.S. Cl.
CPC ............. *H03K 17/18* (2013.01); *H03K 17/61* (2013.01); *H03K 17/668* (2013.01); *H03K 17/6874* (2013.01); *H03K 17/691* (2013.01); *H03K 2017/066* (2013.01)

(56) References Cited

U.S. PATENT DOCUMENTS

| | | | |
|---|---|---|---|
| 6,323,600 B1 * | 11/2001 | Statnic | H05B 41/2806 315/209 R |
| 6,650,552 B2 | 11/2003 | Takagi et al. | |
| 6,888,728 B2 | 5/2005 | Takagi et al. | |
| 6,934,166 B2 * | 8/2005 | Vinciarelli | H02J 1/102 363/17 |
| 7,898,114 B2 | 3/2011 | Schmidt et al. | |
| 8,487,664 B2 | 7/2013 | Draxelmayr et al. | |
| 8,754,675 B2 | 6/2014 | Draxelmayr et al. | |
| 2007/0014133 A1 | 1/2007 | Shao et al. | |
| 2009/0212759 A1 | 8/2009 | Melanson | |
| 2011/0194313 A1 | 8/2011 | Yoshinaga | |
| 2016/0322184 A1 | 11/2016 | Schmitz et al. | |

FOREIGN PATENT DOCUMENTS

| | | |
|---|---|---|
| DE | 102013114259 A1 | 6/2015 |
| EP | 1261122 A2 | 11/2002 |
| WO | WO2006125664 A1 | 11/2006 |

OTHER PUBLICATIONS

International Preliminary Report on Patentability dated Feb. 7, 2019 in corresponding application PCT/EP2017/068847.

German Office Action dated Jun. 6, 2017 in corresponding application DE102016213944.4.

* cited by examiner

METHOD AND DEVICE FOR CONTROLLING A SEMICONDUCTOR SWITCH

This nonprovisional application is a continuation of International Application No. PCT/EP2017/068847, which was filed on Jul. 26, 2017, and which claims priority to German Patent Application No. 10 2016 213. 944.4, which was filed in Germany on Jul. 28, 2016, and which are both herein incorporated by reference.

BACKGROUND OF THE INVENTION

Field of the Invention

The present invention relates to a method and a device for controlling a semiconductor switch.

Description of the Background Art

Electric-motor-operated driving machines typically have an electric motor, which is connected by means of a converter to a network or an energy storage. For charging the energy storage or for feeding back into the grid, electrical energy is often fed into the energy storage or the grid during a recuperative or regenerative operation of the electric motor. To protect this (load) circuit, bidirectional protection switching devices are desired in particular, which are able to conduct and switch a current flow in both directions.

Such protective switching devices generally have a control and/or regulating circuit and a load circuit coupled thereto for switching the load circuit. For this purpose, the load circuit comprises at least one electronically actuatable semiconductor switch, which is driven by means of a driver circuit of the load circuit. The control circuit and the load circuit are preferably galvanically isolated from one another, wherein control signals of the control circuit are transmitted to the load circuit by means of an optical coupler by signals.

SUMMARY OF THE INVENTION

It is therefore an object of the present invention to provide an improved control method for an electronic semiconductor switch, which is connected in a load circuit. The invention is further based on the object of providing a particularly suitable electronic switching device for protecting a load circuit.

The method of the invention is suitable and designed to drive an electronic semiconductor switch connected in a load circuit. For this purpose, the semiconductor switch is connected between an input terminal, routed to a source, and a load circuit output terminal, routed to a load.

To drive the semiconductor switch, a control circuit is provided which is connected to a supply voltage and has a bridge circuit connected on the primary side to a transformer and to the supply voltage. Further, a load circuit is provided, which is connected to the transformer on the secondary side and has a driver circuit for the semiconductor switch. The driver circuit or the load circuit are hereby suitably routed to a control terminal of the semiconductor switch.

According to the method, the bridge circuit can be controlled by a threshold signal, depending on which a primary signal is generated on the output side at a primary winding of the transformer. Preferably, the primary signal is generated by the driving of the bridge circuit with the threshold signal from the supply voltage. The primary signal is then transmitted by the transformer as a secondary signal to the load circuit which is galvanically isolated from the control circuit. The secondary signal is fed to the driver circuit of the load circuit, which generates a drive signal herefrom for the semiconductor switch.

The threshold signal thus serves substantially as a control signal for the semiconductor switch, wherein the information for triggering a turn-on or turn-off process is included in both the primary signal and the secondary signal. This means that the secondary signal is supplied as a threshold-value-like control signal to the driver circuit, which depending thereon generates the drive signal for the semiconductor switch on its basis. For example, the driver circuit generates the drive signal for the semiconductor switch above a threshold value of the secondary signal. If the secondary signal falls below this threshold value, then, for example, no operating voltage is generated by the driver circuit.

On the one hand, very low switching delay times of the switching device are ensured by the signal transmission by means of a transformer. This means that when the control-circuit-side threshold signal is changed, rapid switching of the load-circuit-side semiconductor switch is enabled.

On the other hand, in addition to the control signals for switching (switching over) the semiconductor switch, the transformer also transfers energy required for operating the driver circuit to the load circuit, and this occurs already galvanically isolated, so that no further means for galvanic isolation are required. In other words, it is possible that the driver circuit of the load circuit is operated only with the secondary signal, that is, with the power or voltage transmitted to the secondary winding of the transformer. This eliminates, for example, additional power supply units for the load circuit, whereby a load circuit execution with the fewest possible components is enabled.

The threshold signal can be amplified by means of a signal amplifier connected upstream of the bridge circuit. This ensures that a sufficiently high power for operating the driver circuit is transmitted to the load circuit with the transformer.

The semiconductor switch can be driven to switch to the off state (electrically non-conducting state, blocking state) with a negative voltage value of the drive signal of the driver circuit. In this case, a voltage value of the drive signal is understood in particular to be a pulse height or level or an amplitude of the drive signal. The smallest possible switching (switching over) times of the semiconductor switch are possible by driving with a negative voltage value of the drive signal. In an application with increased safety requirements, it is hereby conceivable, for example, that the semiconductor switch in the off state is permanently driven with a negative voltage value.

The electronic switching device of the invention is suitable and set up for interrupting a load circuit with at least one electronic semiconductor switch. The semiconductor switch(es) is (are) in this case connected between an input terminal, routed to a source, and a load circuit output terminal, routed to a load.

The switching device comprises a control circuit, connected to a supply voltage, with a bridge circuit connected on the primary side to a transformer and to the supply voltage, and a load circuit, connected on the secondary side to the transformer, with a driver circuit for the at least one semiconductor switch. The load circuit or the driver circuit is in this case routed to a control terminal of the semiconductor switch.

During operation, the transformer transmits galvanically isolated a primary signal from the control circuit to the load circuit in which the driver circuit for the semiconductor switch is connected. A secondary signal of the transformer is routed to the driver circuit, which subsequently generates a drive signal for the semiconductor switch. As a result, a particularly suitable electronic switching device is realized, which in particular has a compact structure with few discrete electronic components.

In an expedient embodiment, the control circuit is connected to the supply voltage via an undervoltage release. As a result, the switching device has an integrated undervoltage protection. In the case of failure of the supply voltage, the control circuit, and thus the or each semiconductor switch in the load circuit, are automatically switched off. Consequently, undefined switching states, which could cause damage or the destruction of the semiconductor switch, are advantageously and easily avoided.

A signal amplifier can be connected upstream of the bridge circuit. The signal amplifier amplifies the threshold signal for driving the bridge circuit. In a suitable refinement, the signal amplifier has, in particular, two amplifier stages connected one behind the other, which are each routed to a bridge branch of the bridge circuit on the output side. The amplifier stages are implemented, for example, as inverted push-pull amplifiers, wherein the output signal of the first amplifier stage is routed, on the one hand, to a bridge branch and, on the other, to the input of the second amplifier stage.

An additional or further aspect of the invention provides that the or each semiconductor switch is monitored for an overcurrent by means of a semiconductor protection circuit of the load circuit, said protection circuit being coupled to the driver circuit and to the transformer. The semiconductor protection circuit and the driver circuit are in this case preferably operated only by the power of the transmitted secondary signal. The semiconductor protection circuit detects the load current of the load circuit preferably via the voltage drop across the semiconductor switch itself. This means that no additional (measuring) shunt resistors are needed. The semiconductor switch is implemented as a power transistor, wherein the load current is detected via the drain-source path and the collector-emitter path. The load current results here from the characteristic of the semiconductor switch used. Starting at a predefinable critical current limit, the semiconductor switch is set to the off state. The coupling of the semiconductor protection circuit to the driver circuit prevents that in the case of an overcurrent, a drive signal is generated by the driver circuit.

For the purpose of bidirectional overload protection of the load circuit, two series-connected semiconductor switches can be connected between an input terminal and an output terminal of the load circuit. This makes it possible with the switching device to conduct and switch current flows in both directions, that is, from a load to a source and vice versa. In this case, it is conceivable, for example, that different triggering thresholds of the semiconductor switches are provided for the two current directions. This is desirable, for example, for applications during a recuperative operation of an electric-motor motor vehicle.

A varistor can be connected in parallel to the semiconductor switches as overvoltage protection. This protects the semiconductor switches from destruction or damage due to overvoltage.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
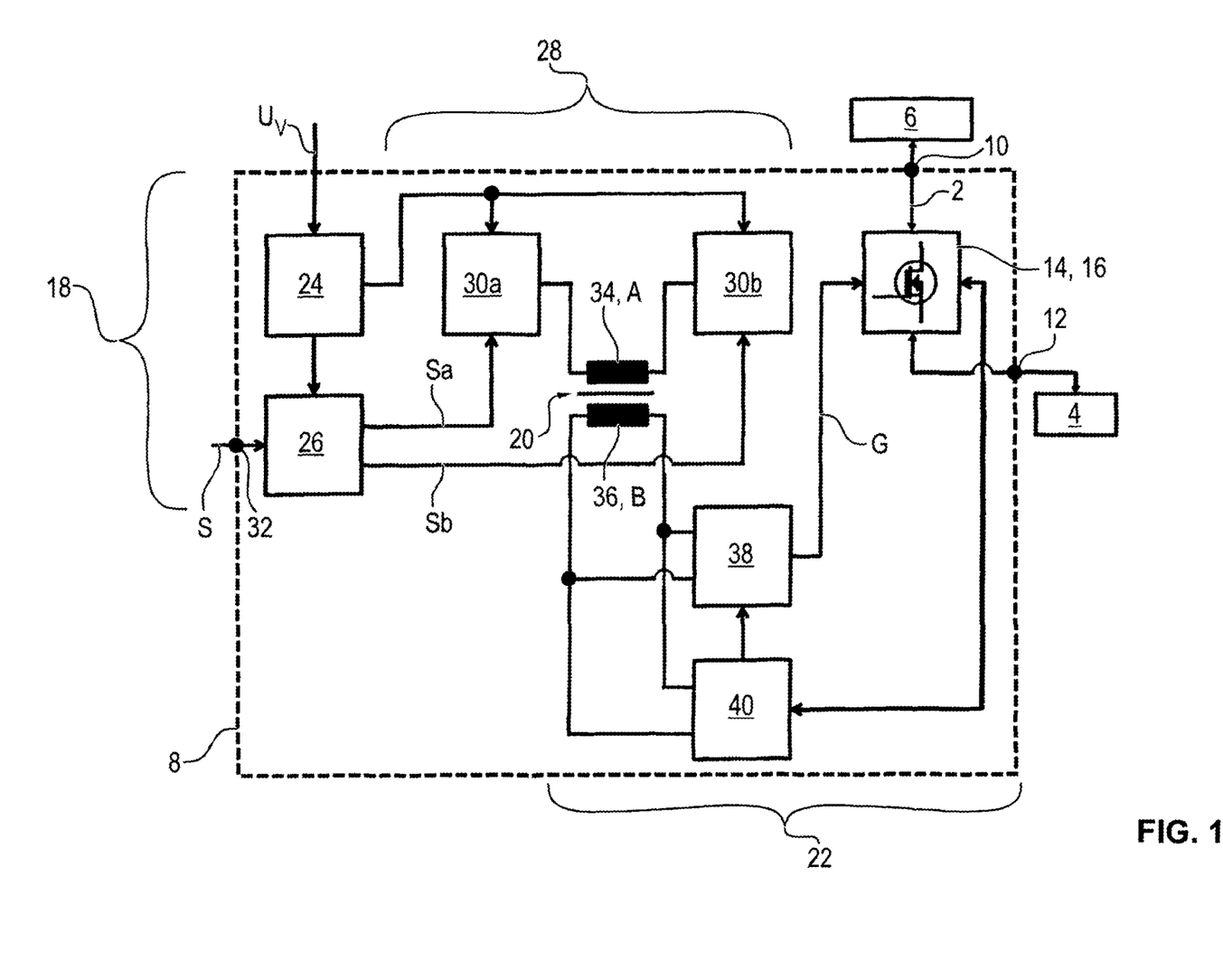
FIG. 1 shows a switching device with a control circuit and a galvanically isolated load circuit.

A load circuit 2 between a load 4 and a source 6 is shown in FIG. 1. A switching device 8 is connected in load circuit 2. Electronic switching device 8 is suitable and configured to protect load 4 or source 6 bidirectionally against an overcurrent. This means that switching device 8 is provided to conduct and to switch current flows in both directions of load circuit 2. For this purpose, switching device 8 is connected to an input terminal 10 and an output terminal 12 between source 6 and load 4.

Two series-connected semiconductor switches 14 and 16 are provided between terminals 10 and 12 for the purpose of bidirectional interruption of the current path of load circuit 2. In this exemplary embodiment, semiconductor switches 14 and 16 are implemented in particular as NMOS power transistors.

In the illustrated exemplary embodiment, load 4 is in particular an electric-motor drive machine and source 6 is an electrical energy storage. During normal operation, load 4 is supplied with electrical energy by source 6, so that a current flows from load 4 to source 6 through load circuit 2. During a recuperative or regenerative operation of load 4, a current is fed from load 4 (regenerative) to source 6.

Switching device 8 substantially comprises a control circuit 18, which is galvanically isolated from a load circuit 22 having semiconductor switches 14 and 16 by a transformer 20. Control circuit 18 is in this case connected to the primary side of transformer 20 and load circuit 22 to the secondary side of transformer 20. Semiconductor switches 14 and 16 are controlled with control circuit 18 via transformer 20 implemented in particular as a ferrite toroidal transformer.

Figure 2:
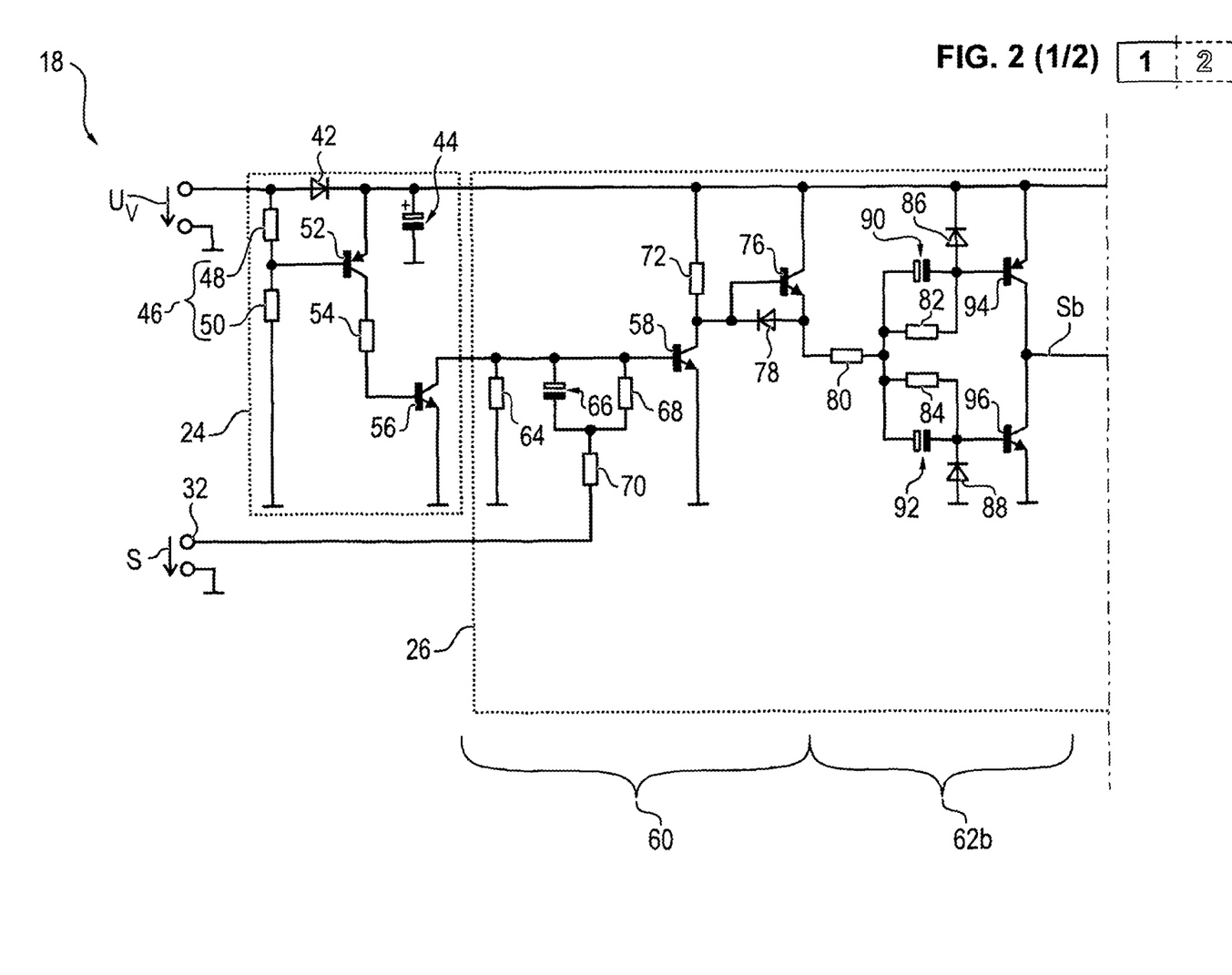
FIG. 2 shows the control circuit with an undervoltage release and with a signal amplifier as well as with a bridge circuit.

Control circuit 18 shown separately in FIG. 2 is connected by means of an undervoltage release 24 as undervoltage protection to a supply voltage $U_V$. Control circuit 18 further has a signal amplifier 26, which drives a bridge circuit 28 with two bridge branches 30a and 30b. A threshold signal S is supplied to protection circuit 8 via a terminal 32.

Threshold signal S is generated, for example, by a controller, monitoring load circuit 2, or by a sensor unit. The injected threshold signal S is amplified by means of signal amplifier 26 and for driving bridge circuit 28 is supplied to bridge branch 30a as an amplified threshold signal Sa and to bridge branch 30b as an amplified threshold signal Sb.

A primary winding 34 of transformer 20 is connected on the output side between bridge branches 30a and 30b. Bridge circuit 28 is connected to undervoltage release 24 and thus to the supply voltage $U_V$. Bridge circuit 28, in particular bridge branches 30a and 30b in combination with transformer 20, is implemented here as a self-oscillating flux converter. Here, the switching elements of bridge branches 30a and 30b are controlled with the amplified threshold signals Sa or Sb such that bridge branches 30a and 30b feed a primary signal A into primary winding 34 of transformer 20 from the supply voltage $U_V$.

The power of the primary signal (input voltage) A is transmitted to the secondary side of transformer 20, where it is tapped as a secondary signal (output voltage) B at a secondary winding 36 connected to load circuit 22. Secondary signal B is fed, on the one hand, to a driver circuit 38 and, on the other hand, to a semiconductor protection circuit 40 of load circuit 22 shown separately in FIG. 3. Depending on secondary signal B, driver circuit 38 generates a drive signal G, which is supplied to the control terminals (gates) of semiconductor switches 14 and 16.

The structure of control circuit 18 is explained in greater detail below with reference to FIGS. 2 and 4 to 6.

If the supply voltage $U_V$ fails, signal amplifier 26 and bridge circuit 28 are reliably switched off by undervoltage release 24. As a result, therefore, semiconductor switches 14 and 16 are also automatically turned off by undervoltage release 24 shown in FIG. 4. Consequently, undefined switching states of semiconductor switches 14 and 16 are avoided.

Figure 4:
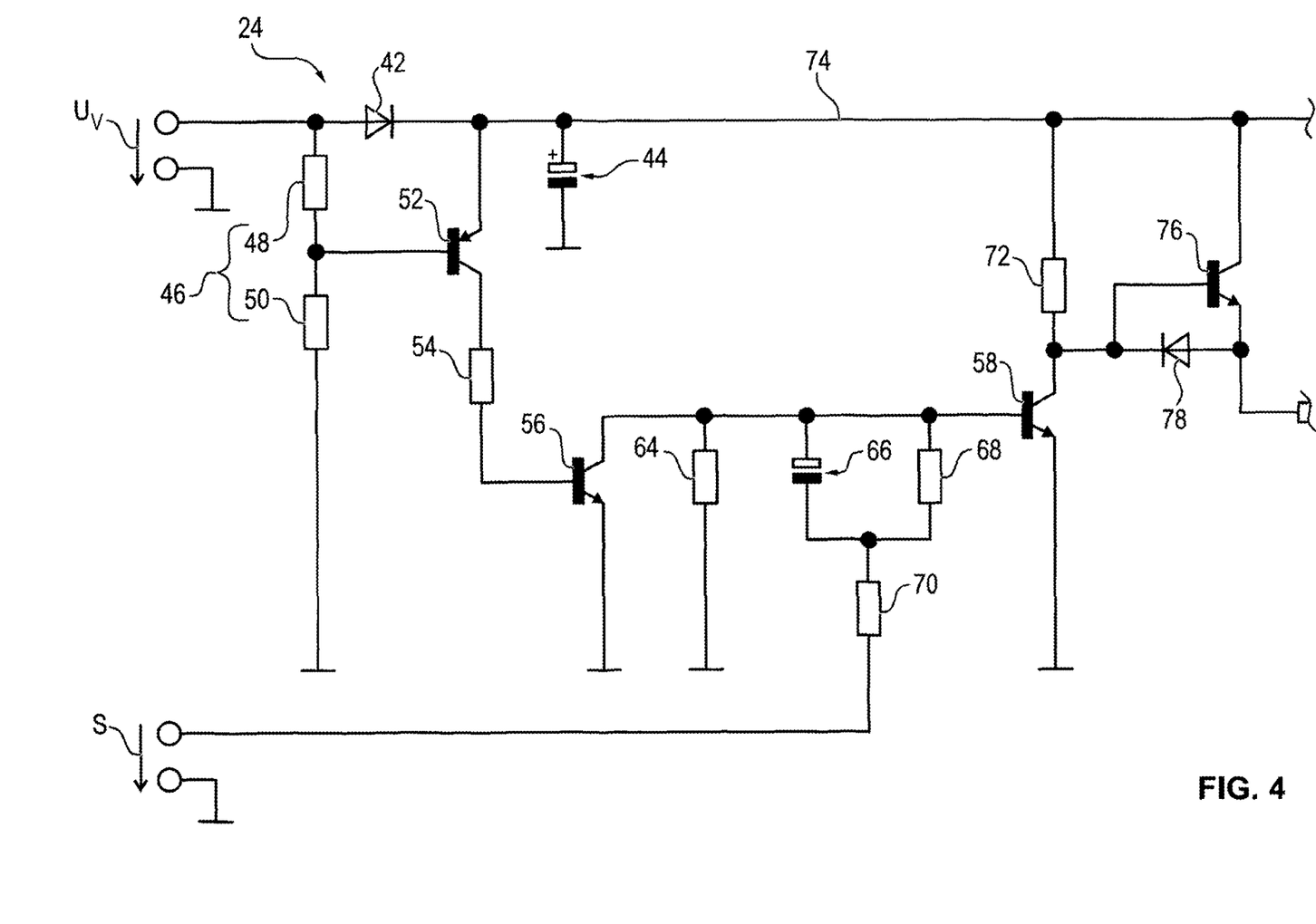
FIG. 4 shows a detail of the undervoltage release.

Undervoltage release 24 has on the input side a diode 42, which is routed to a capacitor 44 connected to ground. Undervoltage release 24 further comprises a voltage divider 46 with two ohmic resistors 48 and 50, wherein resistor 50 has a substantially higher resistance than resistor 48. Voltage divider 46 is connected, on one side, to resistor 48 upstream of diode 42 and, on the other, to resistor 50 to ground. The voltage tap of voltage divider 46 is routed to a base terminal of a transistor 52.

Transistor 52 is connected on the emitter side between diode 42 and capacitor 44. The collector terminal of transistor 52 is contacted via an ohmic resistor 54 to a base terminal of a transistor 56. Transistor 56 is routed on the emitter side to ground and on the collector side to a base terminal of a transistor 58 of signal amplifier 26.

During operation, capacitor 44 is charged via diode 42. Due to the higher resistance value of resistor 50, the base and emitter terminals of transistor 52, in particular implemented as a PNP transistor, are substantially at the same (voltage) potential. Consequently, transistor 52 is switched to a blocking state, i.e., electrically non-conducting state.

When the supply voltage $U_V$ drops, a discharge of capacitor 44 via diode 42 is prevented. As a result, the emitter-base voltage of transistor 52 increases, as a result of which it is switched to a conducting state. The resulting current flow activates transistor 56, which is implemented as an NPN transistor and which pulls the input of signal amplifier 26, that is, transistor 58, to ground. Consequently, signal amplifier 26 is turned off independently of threshold signal S, semiconductor switches 14 and 16 being turned off as a result (off state). In the case of a short circuit at the connection of the supply voltage $U_V$, resistor 48 limits the emitter-base current of transistor 52, as a result of which the transistor is protected from damage or destruction.

Figure 5:
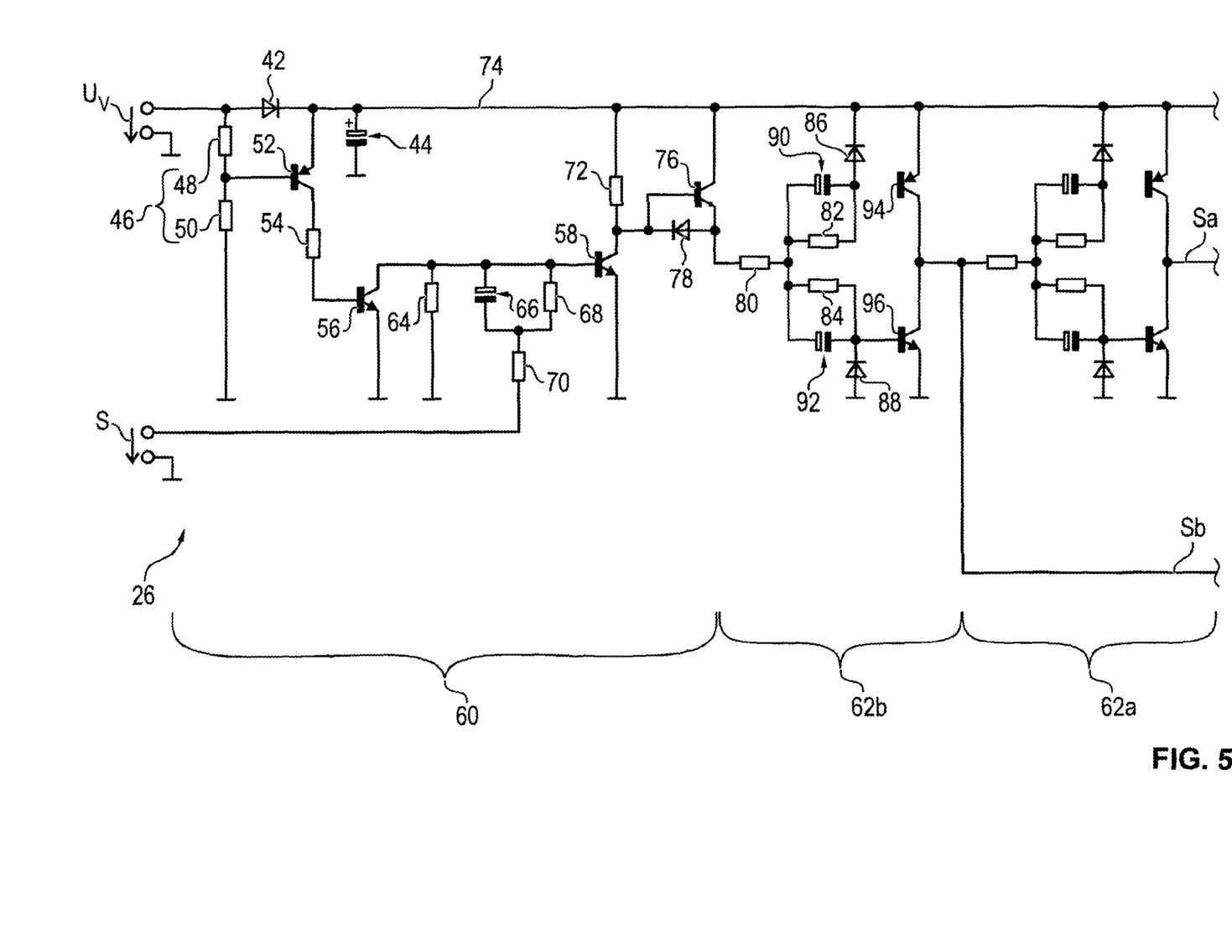
FIG. 5 shows a detail of the signal amplifier with two amplifier stages.

Signal amplifier 26 shown in FIG. 5, depending on the threshold signal (input signal) S and undervoltage release 24, in each case generates an amplified threshold signal Sa, Sb as a control signal (output signal, control voltage) for bridge branches 30a and 30b. Signal amplifier 26 substantially comprises an input stage 60 and two amplifier stages 62a and 62b.

Input stage 60 has an ohmic resistor 64 connected to ground, which is connected in parallel to transistor 56. A capacitor 66 and an ohmic resistor 68 are connected in parallel between resistor 64 and the base terminal of transistor 58, wherein the threshold signal S is supplied between capacitor 66 and resistor 68 via an ohmic resistor 70.

Transistor 58 is connected to ground on the emitter side. On the collector side, transistor 58 is contacted via an ohmic resistor 72 to a line 74 having diode 42. Parallel to resistor 72, a transistor 76 is connected to line 74 on the collector side, wherein its base terminal is connected between the collector terminal of transistor 58 and resistor 72. A diode 78 is connected between the emitter terminal and the base terminal of transistor 76. An ohmic resistor 80 of amplifier stage 62a is connected between the emitter terminal of transistor 76 and diode 78.

Amplifier stages 62a and 62b are constructed substantially identically as inverting push-pull amplifiers; therefore, by way of example, only the structure of amplifier stage 62b is explained in greater detail below. Furthermore, in the figures, by way of example only the components of amplifier stage 62b are provided with reference numerals.

Two ohmic resistors 82 and 84, which are connected by means of a respective diode 86 or 88 to ground or to line 74, are connected to resistor 80. In parallel to resistors 82 and 84, a capacitor 90, 92 each is connected between resistors 80 and 82 and diode 86 or between resistors 80 and 84 and diode 88.

The base terminal of a transistor 94, connected to line 74 on the emitter side, is contacted at the junction between resistor 82 and diode 86 and capacitor 90. Accordingly, the junction between resistor 84 and diode 88 and capacitor 92 is contacted to the base terminal of a transistor 96 connected to ground on the emitter side. Transistor 94 is in this case connected on the collector side to the collector terminal of transistor 96, wherein the output terminal of amplifier stage 62a is between transistors 94 and 96. The output of amplifier stage 62b is here routed on one side to resistor 80 of amplifier stage 62a and on the other side to bridge branch 30b. The output of amplifier stage 62a is routed to bridge branch 30a.

The threshold signal S is fed to input stage 60. It is possible to predetermine via the resistance values of resistors 64 and 68 which voltage amplitude (voltage value, voltage level) of the threshold signal S leads to the turning on of transistor 58. Capacitor 66 causes a momentary high base current at the turn-on time, so that transistor 58 turns on relatively quickly. Resistor 70 limits hereby the flowing base current.

When transistor 58 turns on, the voltage at its collector terminal is substantially reduced to 0 V. As a result, a current flows through diode 78 and resistors 80 and 82. The current continues to flow through capacitor 90 and the base terminal of transistor 94 for a short time. Consequently, transistor 94 turns on, so that its collector terminal is pulled to the operating voltage of line 74. At the same time, transistor 96 is switched to be non-conducting, because its base terminal is substantially at the ground potential via resistors 80 and 84 and diode 78 and the turned-on transistor 58.

If transistor 58 is switched off, that is, if it is connected non-conductively or blocking, the potential at its collector terminal rises to the operating voltage of line 74. Transistor 76 functions as a voltage follower here and acts as an impedance converter during the switching process because of its current gain. As a result, a high switching current for the downstream amplifier stage 62b is generated for a short time. When transistor 76 turns on, a current flows through resistors 80 and 84, as well as briefly through capacitor 92 and the base terminal of transistor 96. As a result, transistor 96 turns on, so that its collector terminal is pulled to ground. At the same time, transistor 94 blocks because its base terminal is substantially at the operating voltage of line 74 via resistors 80 and 82 and via turned-on transistor 76.

Capacitors 90 and 92 enable a fast switching operation, wherein the respective (switching) current is limited by resistor 80. Amplifier stage 62b functions as an inverting push-pull amplifier and generates a threshold signal Sb for bridge branch 30b, which is further fed as an input signal to amplifier stage 62a. Amplifier stage 62a subsequently generates the threshold signal Sa for bridge branch 30a.

Figure 6:
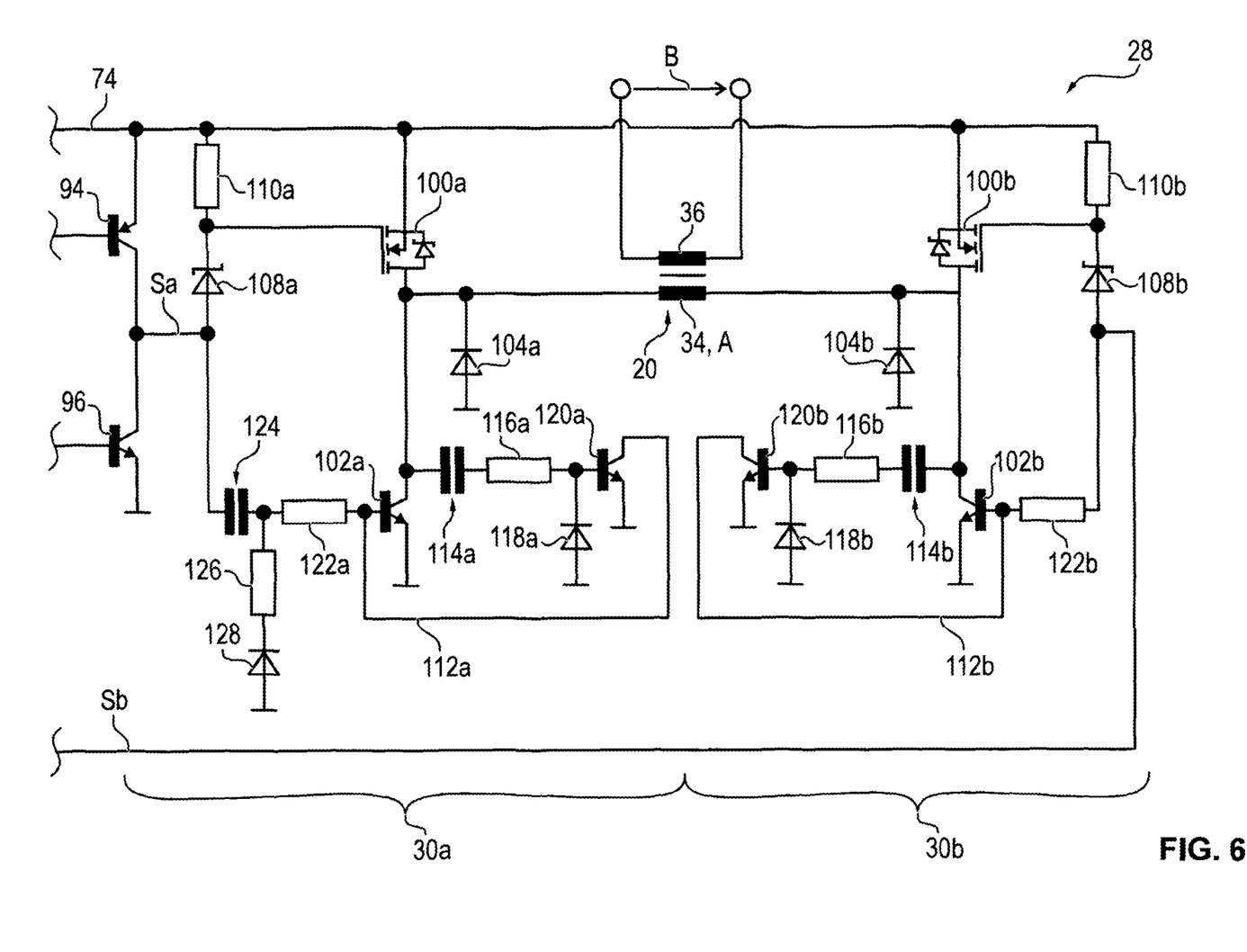
FIG. 6 shows a detail of the bridge circuit with two bridge branches routed to a transformer.

The structure of bridge circuit 28 is explained in greater detail below with use of FIG. 2 and FIG. 6. To drive transformer 20, bridge circuit 28 is implemented as an H-full bridge (H-bridge, H-circuit) with two substantially identical bridge branches 30a and 30b. The structure of bridge branch 30a is explained in particular below. Corresponding parts and parameters of bridge branches 30a and 30b are each provided with reference numeral suffixes "a" and "b." Bridge branch 30a has, in comparison with bridge branch 30b, an additional assembly 98, which is surrounded by a dashed line in FIG. 2.

Bridge branch 30a comprises two transistors 100a and 102a and a freewheeling diode 104a. Bridge branch 30b has correspondingly two transistors 100b and 102b and a freewheeling diode 104b. Due to the construction of bridge circuit 28 as a self-oscillating flux converter, it is possible to transmit both positive and negative output voltage pulses of different amplitudes as the primary signal A to load circuit 22.

The output of amplifier stage 62a is connected between an ohmic resistor 106a and a Z-diode (Zener diode) 108a of bridge branch 30a. Z-diode 108a is connected to line 74 by means of an ohmic resistor 110a, wherein the gate terminal of transistor 100a implemented as a PMOS transistor is connected between Z-diode 108a and resistor 110a. Transistor 100a is connected to line 74 on the source side and routed to a terminal of primary winding 34 of transformer 20 on the drain side. The grounded freewheeling diode 104a is disposed between primary winding 34 and transistor 100a.

Transistor 102a implemented in particular as an NPN transistor is contacted on the collector side with the drain terminal of transistor 100a and is connected to ground on the emitter side. A current path 112a is connected in parallel between the collector terminal and the base terminal of transistor 102a. Current path 112a comprises a capacitor 114a with a series-connected ohmic resistor 116a. A diode 118a contacted to ground is connected downstream of resistor 116a, wherein the base terminal of a transistor 120a is connected between resistor 116a and diode 118a. Transistor 120a is routed to ground on the emitter side and with current path 112a to the base terminal of transistor 102a on the collector side. The base terminal of transistor 102a is further connected by means of an ohmic resistor 122a to the output of amplifier stage 62a and to Z-diode 108a.

Bridge branch 30a has the assembly 98 between the amplifier terminal and resistor 122a. Assembly 98 has a capacitor 124 connected between Z-diode 108a and resistor 122a. Between capacitor 124 and resistor 122a, an ohmic resistor 126 is connected to ground by means of a diode 128.

Control signals Sa and Sb are substantially inverted with regard to one another. This means that during a turn-on process, control signal Sb of bridge branch 30b substantially has the reference potential, whereas control signal Sa for bridge branch 30a corresponds to the ground potential. Consequently, the base terminal of transistor 102a is grounded, and the gate terminal of transistor 100a is connected to ground plus the breakdown voltage of Z-diode 108a. Consequently, transistor 102a is switched to a non-conducting state and transistor 100a to a conducting state. In bridge branch 30b, transistor 102b is correspondingly switched to conduct and transistor 100b to be non-conductive. Consequently, a current flow is enabled through transistor 100a and primary winding 34 to transistor 102a.

The current increases until transistor 102a exceeds its saturation region. In this case, the voltage at the collector terminal of transistor 102a rises, so that a current flows through capacitor 114b and resistor 116b into the base terminal of transistor 120b. Consequently, transistor 120b becomes conductive and as a result, the base terminal of transistor 102b is connected to ground and transistor 102b becomes blocking. The energy stored in the inductor of primary winding 34 continues to drive the current through the turned-on transistor 100a as well as through the internal freewheeling diodes of transistor 100b. As a result, the current is substantially completely reduced. Consequently, transistor 120b is switched to block, which again enables a current flow through transistor 102b, so that it is again activated (oscillation process).

When transistor 102b is turned on, the output voltage or the secondary signal B of transformer 20 is substantially given by the product of its transformation ratio and the operating voltage or of primary signal A. If the flux converter is in the freewheeling phase, then only the voltage across freewheeling diode 104a or 104b drops at primary winding 34, so that secondary signal B is substantially given by the product of the transformation ratio and this voltage as primary signal A. For free-wheeling diodes 104a, 104b made of silicon, this voltage is typically about 0.7 V.

In the course of a turn-off operation, control signal Sa of bridge branch 30a has substantially the reference potential and control signal Sb for bridge branch 30b is at the voltage level of the ground potential. Consequently, the base terminal of transistor 102b is grounded and the gate terminal of transistor 100b is connected in the turned-on state. In bridge branch 30a, transistor 100a accordingly is switched to block and transistor 102a is switched to conduct.

The oscillation process is substantially identical to the turn-on operation described above due to the similar structure of bridge branches 30a and 30b. The base current for transistor 102a is limited in time, however, by capacitor 124 of assembly 98. As a result, this leads to a relatively low current consumption of transistor 102a in the turned-off state, so that the oscillation process is terminated automatically. When turned on again, capacitor 124 is discharged via diode 128 and resistor 126.

Secondary signal B of transformer 20 has substantially an inverted sign during the turn-off process in comparison with the turn-on process.

Depending on the different voltage values of secondary signal B of transformer 20, driver circuit 38 generates an operating voltage as (drive) control signals G for semiconductor switches 14 and 16. The structure of driver circuit 38 is explained below with reference to FIG. 3 and FIG. 7.

Figure 3:
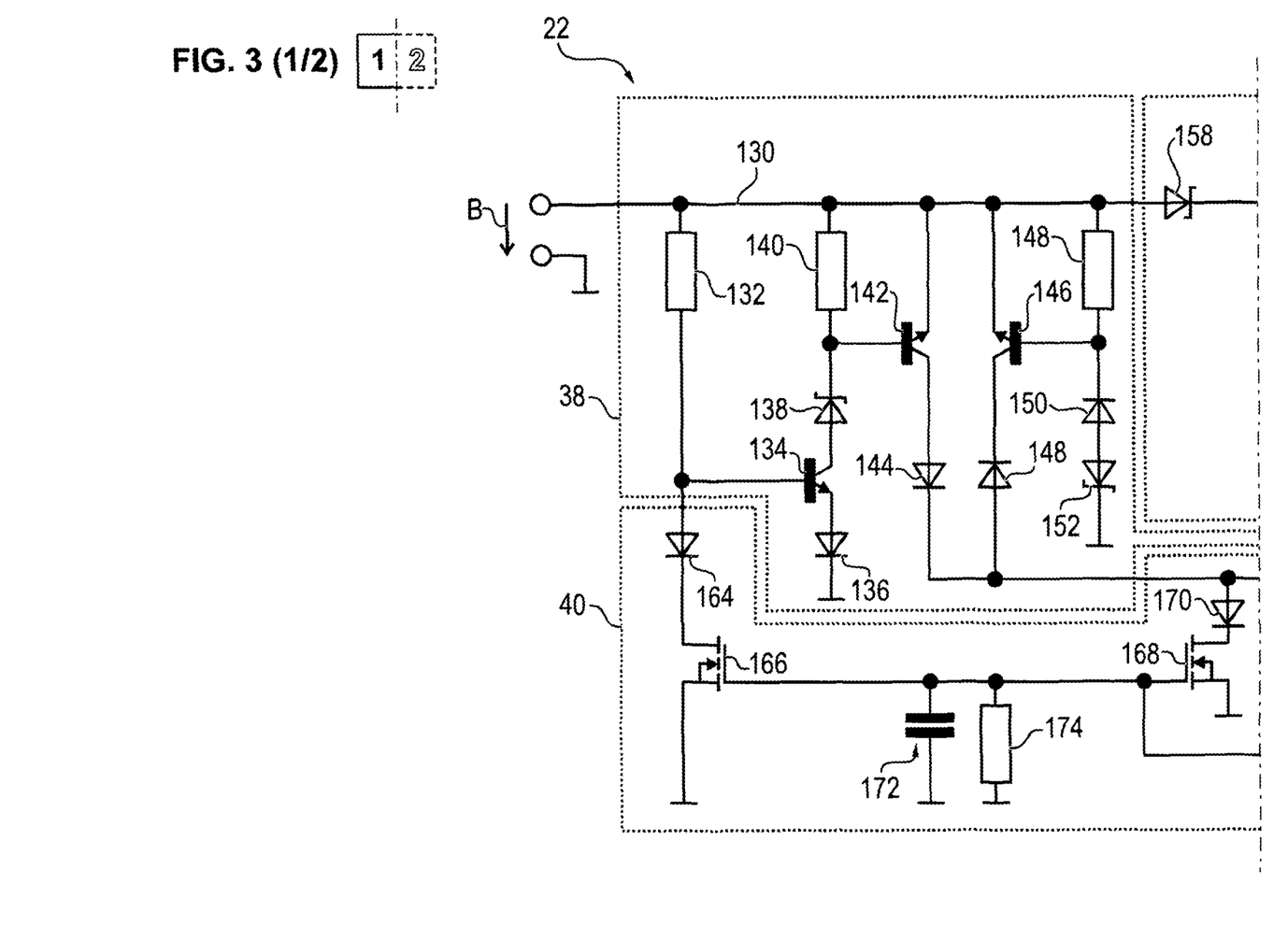
FIG. 3 shows the load circuit with a driver circuit and with a semiconductor protection circuit as well as with two electronic semiconductor switches.
Figure 7:
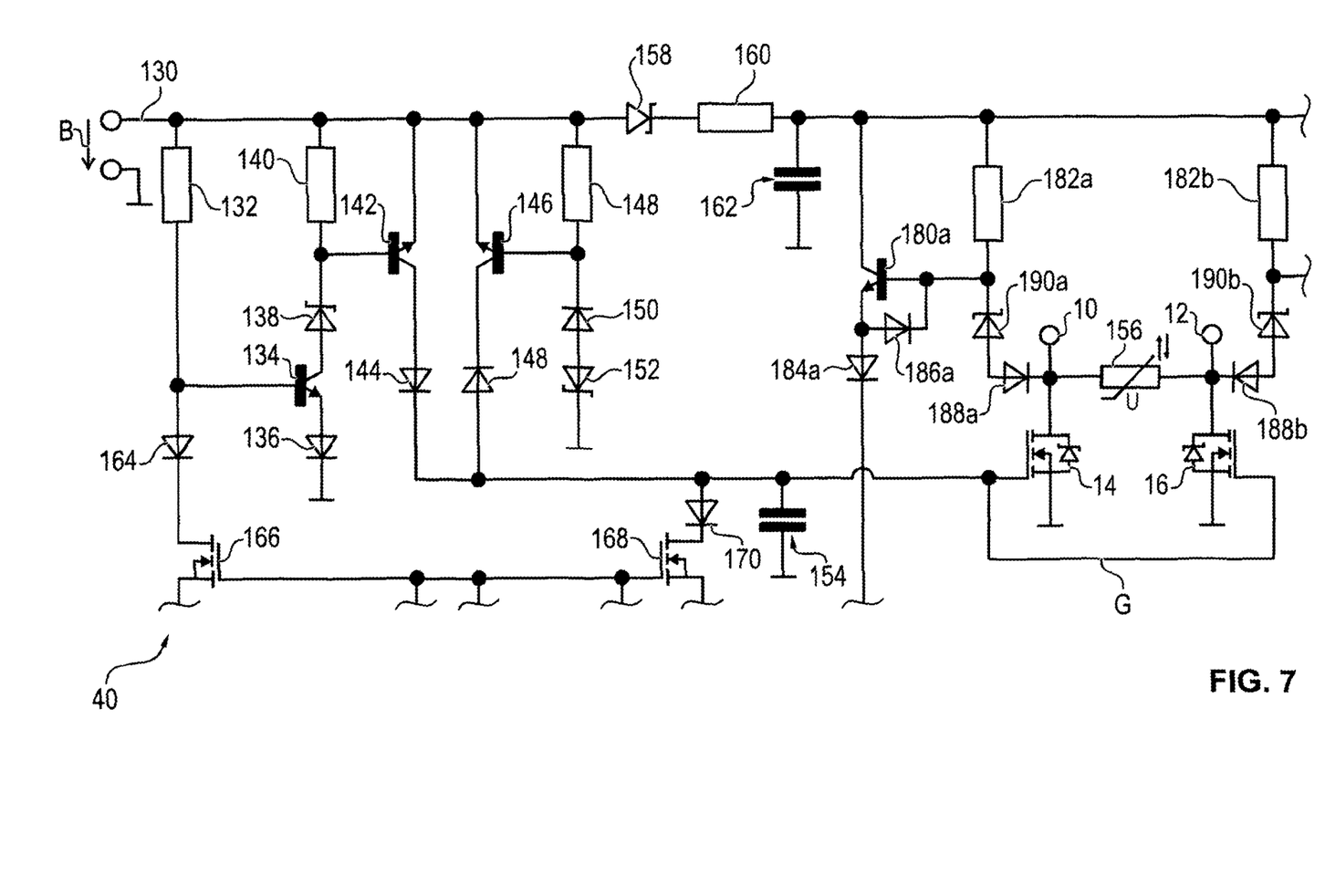
FIG. 7 shows a detail of the driver circuit.

Driver circuit 38 is connected to secondary winding 36 of transformer 20 and is contacted by semiconductor protection circuit 40 with semiconductor switches 14 and 16. In this case, load circuit 22 has a line 130 connected to secondary winding 36. A resistor 132 of driver circuit 38 is connected to line 130, and the base terminal of a transistor 134 is connected downstream of said resistor. Transistor 134 is connected to ground on the emitter side with a diode 136 and is routed to line 130 via a Z-diode 138 and a resistor 140 on the collector side.

A transistor 142 is connected on the base side between Z-diode 138 and resistor 140. The emitter terminal of transistor 142 is connected to line 130 and the collector terminal of transistor 142 is routed via a diode 144 to the gate terminals of semiconductor switches 14 and 16. Parallel to transistor 142, a transistor 146 is contacted on the emitter side to line 130. The collector terminal of transistor 146 is contacted by a diode 148 between diode 144 and the gate terminals of semiconductor switches 14 and 16. Parallel to transistor 146, a grounded series connection of a resistor 148, a diode 150, and a Z-diode 152 is connected to line 130. The base terminal of transistor 146 is in this case contacted between resistor 148 and diode 150. Driver circuit 38 further comprises a grounded capacitor 154 which is contacted between diode 148 and the gate terminals of semiconductor switches 14 and 16.

To protect semiconductor switches 14 and 16 from damage or destruction due to overvoltage, a varistor 156 is integrated between terminals 10 and 12.

For a turn-on process for semiconductor switches 14 and 16, a positive voltage pulse is transmitted as a secondary signal B to load circuit 22. Transistor 134 is turned on due to the positive voltage. At a sufficiently high (voltage) amplitude of the secondary signal B, a current flows through resistor 140 and Z-diode 138 and through transistor 134 and diode 136. If a sufficiently high voltage drops at resistor 140, transistor 142, which is implemented in particular as a PNP transistor, turns on, so that capacitor 154 and the gates of semiconductor switches 14 and 16 are charged. Consequently, both semiconductor switches 14, 16 are switched to conduct, so that a current flow through terminals 10 and 12 is possible.

Because driver circuit 38 always turns on only above a certain threshold value of the amplitude of secondary signal B, capacitor 154 is not discharged during the freewheeling phase of transformer 20. Due to the voltage pulses regularly transmitted during operation, capacitor 154 is periodically recharged, so that semiconductor switches 14 and 16 are always reliably switched to conduct. In this case, diode 144 prevents capacitor 154 from being discharged during the freewheeling phase of transformer 20.

In a turn-off operation of semiconductor switches 14 and 16, a negative voltage pulse is transmitted as a secondary signal B to load circuit 22. If the secondary signal B has a sufficiently high negative (voltage) amplitude, then a current flows through resistor 148 and diode 150 and Z-diode 152. With a sufficiently high voltage drop across resistor 148, transistor 146, which is implemented in particular as an NPN transistor, turns on, so that capacitor 154 and the gates of semiconductor switches 14 and 16 are transferred to a negative voltage. Consequently, semiconductor switches 14 and 16 are not switched to conduct, so that the current flow through terminals 10 and 12 is interrupted. By driving by means of a negative voltage, a particularly fast and reliable turning off of semiconductor switches 14 and 16 is ensured.

In a suitable dimensioning of capacitor 154, its capacitance is, on the one hand, as low as possible, so that a complete charge is ensured, even with comparatively short voltage pulses of secondary signal B. This prevents semiconductor switches 14 and 16 from being turned on incompletely and thus being damaged or destroyed.

On the other hand, the largest possible capacitance of the capacitor 154 is desirable, whereby the drive signal G controlling semiconductor switches 14 and 16 is smoothed. This is advantageous because capacitor 154 and the gates of semiconductor switches 14 and 16 can discharge via parasitic resistors during the freewheeling phases of transformer 20.

Furthermore, capacitor 154 counteracts a parasitic driving of semiconductor switches 14 and 16, when a transient voltage via parasitic capacitances of semiconductor switches 14 and 16 couples through to the respective gate. To improve safety, it is conceivable, for example, for the gates of semiconductor switches 14 and 16 to be supplied with a drive signal G with a permanently negative voltage amplitude (voltage level, voltage value).

During operation of switching device 8, the current flow through semiconductor switches 14 and 16 is monitored by means of semiconductor protection circuit 40. If the current flow exceeds a predetermined threshold, then semiconductor switches 14 and 16 are turned off, i.e., switched to a blocking state. Semiconductor switches 14 and 16 remain in an off state until semiconductor protection circuit 40 is reset by means of a turn-off signal. The structure of semiconductor protection circuit 40 is explained in greater detail below with reference to FIG. 3.

Semiconductor protection circuit 40 is connected to line 130 by means of a Z-diode 158 and an ohmic resistor 160 and a grounded capacitor 162. Further, semiconductor protection circuit 40 is coupled via a diode 164 to the base terminal of transistor 134 of driver circuit 38. Diode 164 is contacted in the forward direction to a drain terminal of a transistor 166 connected to ground on the source side. The gate terminal of transistor 166 is connected to the gate terminal of a transistor 168. Transistor 168 is connected to ground on the source side and contacted to driver circuit 38 on the drain side by means of a diode 170 between diode 148 and capacitor 154.

A capacitor 172 and an ohmic resistor 174 in each case are connected to ground between the gate terminals of transistors 166 and 168. The gate terminals of transistors 166 and 168 are further routed to two current monitoring circuits 178a and 178b by means of a Z-diode 176. Current monitoring circuits 178a and 178b are coupled to line 130. Current monitoring circuit 178a is contacted in this case between terminal 10 and semiconductor switch 14. Current monitoring circuit 178b is contacted accordingly between the terminal clamp of terminal 12 and semiconductor switch 16.

Current monitoring circuits 178a and 178b are constructed substantially the same, wherein, in particular, the structure of current monitoring circuit 178a is explained below. Corresponding parts and parameters of current monitoring circuits 178a and 178b are respectively provided with corresponding reference numeral suffixes "a" and "b."

Current monitoring circuit 178a comprises a transistor 180a, an ohmic resistor 182a, three diodes 184a, 186a, 188a, and a Z-diode 190a. Transistor 180a is connected to line 130 on the collector side and downstream to Z-diode 176 on the emitter side. Diode 184a is connected between the emitter terminal of transistor 180a and Z-diode 176. Diode 186a is connected between diode 184a and the emitter terminal of transistor 180a, and connects the emitter terminal of transistor 180a to the base terminal thereof. Parallel to transistor 180a, resistor 182a is connected to line 130. Resistor 182a and the base terminal of the transistor 180a are routed by means of Z-diode 190a and diode 188a to the junction between terminal 10 and semiconductor switch 14.

At a positive value of the secondary signal B, capacitor 162 is charged via Z-diode 158 and resistor 160. The time constant of the charging process in this case ensures a short delay between the turning on of semiconductor switches 14 and 16 and the activation of semiconductor protection circuit 40. The time constant is chosen to be relatively short here, so that even in the case of switching to a short circuit, semiconductor switches 14 and 16 are reliably and safely protected. Z-diode 158 ensures that a fast discharge of capacitor 162 occurs at a secondary signal B with a negative voltage amplitude, so that semiconductor protection circuit 40 does not trip when it is turned on again.

Capacitor 162 feeds a current through resistors 182a, 182b and diodes 184a, 184b and Z-diodes 190a, 190b in the drain-source path of semiconductor switches 14 or 16. The potential between Z-diodes 190a, 190b and resistors 182a, 182b corresponds to the forward voltage of semiconductor switches 14 and 16, plus the saturation voltage of diode 150 and the breakdown voltages of Z-diodes 190a, 190b. A monitoring of the current flow is thus realized by knowing the characteristics of semiconductor switches 14 and 16. In particular, semiconductor switches 14 and 16 are turned off when a certain current value (trip current) is exceeded.

Resistors 182a, 182b are relatively high-impedance, so that capacitor 162 is only slightly discharged between the recharging pulses of secondary signal B. In order to enable a fast turn-off in the event of a fault, transistors 180a, 180b act as impedance converters in the event of tripping.

Diodes 186a, 186b serve to protect the respective transistors 180a, 180b. Diodes 184a and 184b thereby enable a parallel connection of current monitoring circuits 178a and 178b.

If the voltage across Z-diode 176 increases to the value of its breakdown voltage, capacitor 172 and thus the gates of transistors 166 and 168, which are implemented in particular as NMOS transistors, are charged. When this charge voltage reaches a value in the range of the threshold voltages of transistors 166 and 168, the drain-source paths of transistors 166 and 168 become electrically conductive. As a result, the potential at the gate terminals of semiconductor switches 14 and 16 is reduced, whereby their electrical conductivity is also reduced. This causes a further increase of the drain-source voltage and thus an increased activation of transistors 166 and 168. Due to this positive feedback, semiconductor switches 14 and 16 are turned off reliably and quickly.

By adapting Z-diode 176, the value of the tripping current can be increased or reduced by means of Z-diodes 190a and 190b.

When transistor 166 is turned on, the base current of transistor 134 is interrupted. Consequently, transistor 142 is no longer activated, whereby a recharging of capacitor 154 is prevented.

Capacitor 172 and resistor 174 serve as (RC) filters and prevent triggering of the overcurrent protection of semiconductor protection circuit 40 at a brief exceeding of the tripping current.

The invention is not limited to the exemplary embodiment described above. Rather, other variants of the invention can also be derived herefrom by the skilled artisan, without going beyond the subject of the invention. Particularly, further all individual features described in relation to the exemplary embodiment can also be combined with one another in a different manner, without going beyond the subject of the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims:

What is claimed is:

1. A method for controlling an electronic semiconductor switch connected in a load circuit, the semiconductor switch being connected between an input terminal routed to a source and an output terminal of the load circuit, the output terminal being routed to a load, the method comprising:
    connecting a control circuit to a supply voltage and having a bridge circuit connected on a primary side to a transformer and to the supply voltage;
    connecting a load circuit to the transformer on a secondary side and having a driver circuit for the semiconductor switch;
    routing a threshold value signal to the bridge circuit on the control side;
    generating, via the bridge circuit, a primary signal that is transmitted as a secondary signal to the load circuit that is galvanically isolated from the control circuit;
    providing the secondary signal to the driver circuit, which generates a drive signal for the semiconductor switch, and
    connecting a varistor in parallel to the semiconductor switch as overvoltage protection.

2. The method according to claim 1, wherein the threshold value signal is amplified via a signal amplifier connected upstream of the bridge circuit.

3. The method according to claim 1, wherein the semiconductor switch is driven to switch to an off state with a negative voltage value of the drive signal of the driver circuit.

4. An electronic switching device for interrupting a load circuit, the device comprising:
    at least one electronic semiconductor switch connected between an input terminal routed to a source and an output terminal routed to a load;
    a control circuit connected to a supply voltage;
    a bridge circuit connected on a primary side to a transformer and to the supply voltage;
    a load circuit connected to the transformer on a secondary side; and
    a driver circuit for the semiconductor switch,
    wherein the transformer transmits a primary signal from the control circuit as a secondary signal to the galvanically isolated load circuit, and
    wherein the secondary signal of the transformer is routed to the driver circuit, which generates a drive signal for the semiconductor switch.

5. The switching device according to claim 4, wherein the control circuit is connected to the supply voltage via an undervoltage release.

6. The switching device according to claim 4, wherein a signal amplifier is connected upstream of the bridge circuit.

7. The switching device according to claim 6, wherein the signal amplifier has two amplifier stages connected one behind the other, which are each routed to a bridge branch of the bridge circuit on the output side.

8. The switching device according to claim 4, wherein the semiconductor switch is monitored for overcurrent via a semiconductor protection circuit of the load circuit, the protection circuit being coupled to the driver circuit and the transformer.

9. The switching device according to claim 4, wherein, for bidirectional overload protection of the load circuit, two series-connected semiconductor switches are connected between an input terminal and an output terminal of the load circuit.

10. The switching device according to claim 9, wherein a varistor is connected in parallel to the semiconductor switches as overvoltage protection.

11. The method of claim 2, wherein the signal amplifier has two amplifier stages connected one behind the other, which are each routed to a bridge branch of the bridge circuit on the output side.

12. The electronic switching device of claim 7, wherein the bridge circuit is an H-full bridge (H-bridge, H-circuit) with two substantially identical bridge branches.

* * * * *